United States Patent
Wu et al.

(10) Patent No.: US 10,468,461 B2
(45) Date of Patent: Nov. 5, 2019

(54) METHOD AND APPARATUS FOR PERFORMING DISPLAY CONTROL OF A DISPLAY PANEL EQUIPPED WITH RED, GREEN, BLUE, AND WHITE SUB-PIXELS

(71) Applicants: HIMAX TECHNOLOGIES LIMITED, Tainan (TW); Himax Media Solutions, Inc., Tainan (TW)

(72) Inventors: Tung-Ying Wu, Tainan (TW); Tsai-Hsing Chen, Tainan (TW); Chao-Chen Huang, Tainan (TW)

(73) Assignees: HIMAX TECHNOLOGIES LIMITED, Tainan (TW); Himax Media Solutions, Inc., Tainan (TW)

( * ) Notice: Subject to any disclaimer, the term of this patent is extended or adjusted under 35 U.S.C. 154(b) by 0 days.

(21) Appl. No.: 15/879,453

(22) Filed: Jan. 25, 2018

(65) Prior Publication Data
US 2019/0229159 A1  Jul. 25, 2019

(51) Int. Cl.
*H01L 27/32* (2006.01)

(52) U.S. Cl.
CPC . *H01L 27/3213* (2013.01); *G09G 2310/0264* (2013.01); *G09G 2320/0233* (2013.01)

(58) Field of Classification Search
CPC ........ H01L 27/3213; G09G 2310/0264; G09G 2320/0233
See application file for complete search history.

(56) References Cited

U.S. PATENT DOCUMENTS

| 8,018,476 B2 | 9/2011 | Credelle |
| 2013/0082589 A1* | 4/2013 | So ............... H01L 51/5036 313/504 |
| 2016/0117975 A1* | 4/2016 | Kang ............ G09G 3/2003 345/694 |
| 2017/0330530 A1 | 11/2017 | Ikeda |

FOREIGN PATENT DOCUMENTS

CN      104252699 B      9/2017

* cited by examiner

*Primary Examiner* — Charles V Hicks
(74) *Attorney, Agent, or Firm* — Winston Hsu (57) ABSTRACT

A method and apparatus for performing display control of a display panel having red, green, blue, and white sub-pixels are provided. The method may include: performing hue calculations on pixel data of an image frame to detect a yellow partial image of the image frame and detect a white partial image of the image frame; determining a distance between the yellow partial image and the white partial image; and when the yellow partial image and the white partial image are sufficiently close to each other, changing at least one of brightness of the yellow partial image and brightness of the white partial image to reduce a brightness difference between the yellow partial image and the white partial image, for controlling the display panel to display the yellow partial image and the white partial image with the brightness difference being reduced, to prevent generating an incorrect color related to inherent deficiency.

19 Claims, 6 Drawing Sheets

METHOD AND APPARATUS FOR PERFORMING DISPLAY CONTROL OF A DISPLAY PANEL EQUIPPED WITH RED, GREEN, BLUE, AND WHITE SUB-PIXELS

BACKGROUND OF THE INVENTION

1. Field of the Invention

The present invention relates to display devices, and more particularly, to a method and apparatus for performing display control of a display panel such as that equipped with red, green, blue, and white sub-pixels.

2. Description of the Prior Art

A display panel equipped with red, green, blue, and white sub-pixels may be referred to as an RGBW panel, where R, G, B, and W may stand for red, green, blue, and white, respectively. As the percentage of chromatic sub-pixels (e.g. red, green, and blue sub-pixels) of the RGBW panel, such as 75% or any of other values corresponding to different designs, is lower than that of an RGB panel equipped with red, green, and blue sub-pixels, the RGBW panel typically has lower color brightness than that of the RGB panel. More particularly, when the RGBW panel is displaying chromatic contents, the color and/or the brightness of the chromatic contents may be insufficient and accompanied by observable chromatic defect such as a yellow color greenish effect, in which a video object with the yellow color becomes greenish. For example, when an image having a yellow block (e.g. a yellow rectangular block) on a white background is displayed on the RGB panel, it looks fine; however, when the same image is displayed on the RGBW panel, the yellow block looks yellow with green, or greenish, typically causing poor user experience of an end user of the RGBW panel. Thus, a novel method and associated architecture are required for enhancing the overall performance of a display device.

SUMMARY OF THE INVENTION

One of the objects of the present invention is to provide a method and apparatus for performing display control of a display panel such as that equipped with red, green, blue, and white sub-pixels, to solve the problems which exist in the related arts.

Another of the objects of the present invention is to provide a method and apparatus for performing display control of a display panel such as that equipped with red, green, blue, and white sub-pixels, to guarantee the overall performance of the display system.

According to at least one embodiment of the present invention, a method for performing display control of a display panel is provided, where the display panel may comprise a plurality of pixels, and the plurality of pixels may comprise red, green, blue, and white sub-pixels. For example, the method may comprise: performing hue calculations on pixel data of an image frame to detect a yellow partial image of the image frame and detect a white partial image of the image frame; determining a distance between the yellow partial image and the white partial image, and comparing the distance with a predetermined distance threshold to determine whether the yellow partial image and the white partial image are sufficiently close to each other; and when the yellow partial image and the white partial image are sufficiently close to each other, changing at least one of brightness of the yellow partial image and brightness of the white partial image to reduce a brightness difference between the yellow partial image and the white partial image, for controlling the display panel to display the yellow partial image and the white partial image with the brightness difference being reduced, to prevent generating an incorrect color related to inherent deficiency of display capability of the red, the green, the blue, and the white sub-pixels.

According to at least one embodiment of the present invention, an apparatus for performing display control of a display panel is provided, where the display panel may comprise a plurality of pixels, and the plurality of pixels may comprise red, green, blue, and white sub-pixels. For example, the apparatus may comprise a color detection circuit and at least one adjustment circuit that is coupled to the color detection circuit. The color detection circuit may be arranged to perform hue calculations on pixel data of an image frame to detect a yellow partial image of the image frame and detect a white partial image of the image frame, wherein the color detection circuit may determine a distance between the yellow partial image and the white partial image, and may compare the distance with a predetermined distance threshold to determine whether the yellow partial image and the white partial image are sufficiently close to each other. In addition, the aforementioned at least one adjustment circuit may be arranged to selectively adjust brightness of the yellow partial image and selectively adjust brightness of the white partial image. For example, when the yellow partial image and the white partial image are sufficiently close to each other, the color detection circuit may trigger the aforementioned at least one adjustment circuit to change at least one of the brightness of the yellow partial image and the brightness of the white partial image to reduce a brightness difference between the yellow partial image and the white partial image, for controlling the display panel to display the yellow partial image and the white partial image with the brightness difference being reduced, to prevent generating an incorrect color related to inherent deficiency of display capability of the red, the green, the blue, and the white sub-pixels.

The method and associated apparatus of the present invention may solve problems existing in the related arts without introducing unwanted side effects, or in a way that is less likely to introduce a side effect. In addition, the method and associated apparatus of the present invention can properly control the display panel to display various types of video contents while suppressing or eliminating observable chromatic defect such as the yellow color greenish effect, to guarantee the overall performance of the display system.

These and other objectives of the present invention will no doubt become obvious to those of ordinary skill in the art after reading the following detailed description of the preferred embodiment that is illustrated in the various figures and drawings.

DETAILED DESCRIPTION

Embodiments of the present invention provide a method and apparatus for performing display control of a display panel such as that equipped with red, green, blue, and white sub-pixels. For better comprehension, the display panel may be referred to as an RGBW panel, where R, G, B, and W may stand for red, green, blue, and white, respectively. Examples of the display panel may include, but are not limited to: a liquid crystal display (LCD) panel, and an organic light-emitting diode (OLED) panel. The apparatus may comprise at least one portion (e.g. a portion or all) of a display system equipped with the display panel. For example, the apparatus may comprise a control circuit of the display system, such as an integrated circuit (IC) mounted on a printed circuit board (PCB) within the display system. For another example, the apparatus may comprise the control circuit and at least one driving circuit for driving the display panel. For yet another example, the apparatus may comprise the entirety of the display system, including the display panel. Based on the method, the apparatus can properly control the display system (e.g. the display panel) to display various types of video contents while suppressing or eliminating observable chromatic defect such as a yellow color greenish effect, to guarantee the overall performance of the display system.

Figure 1:
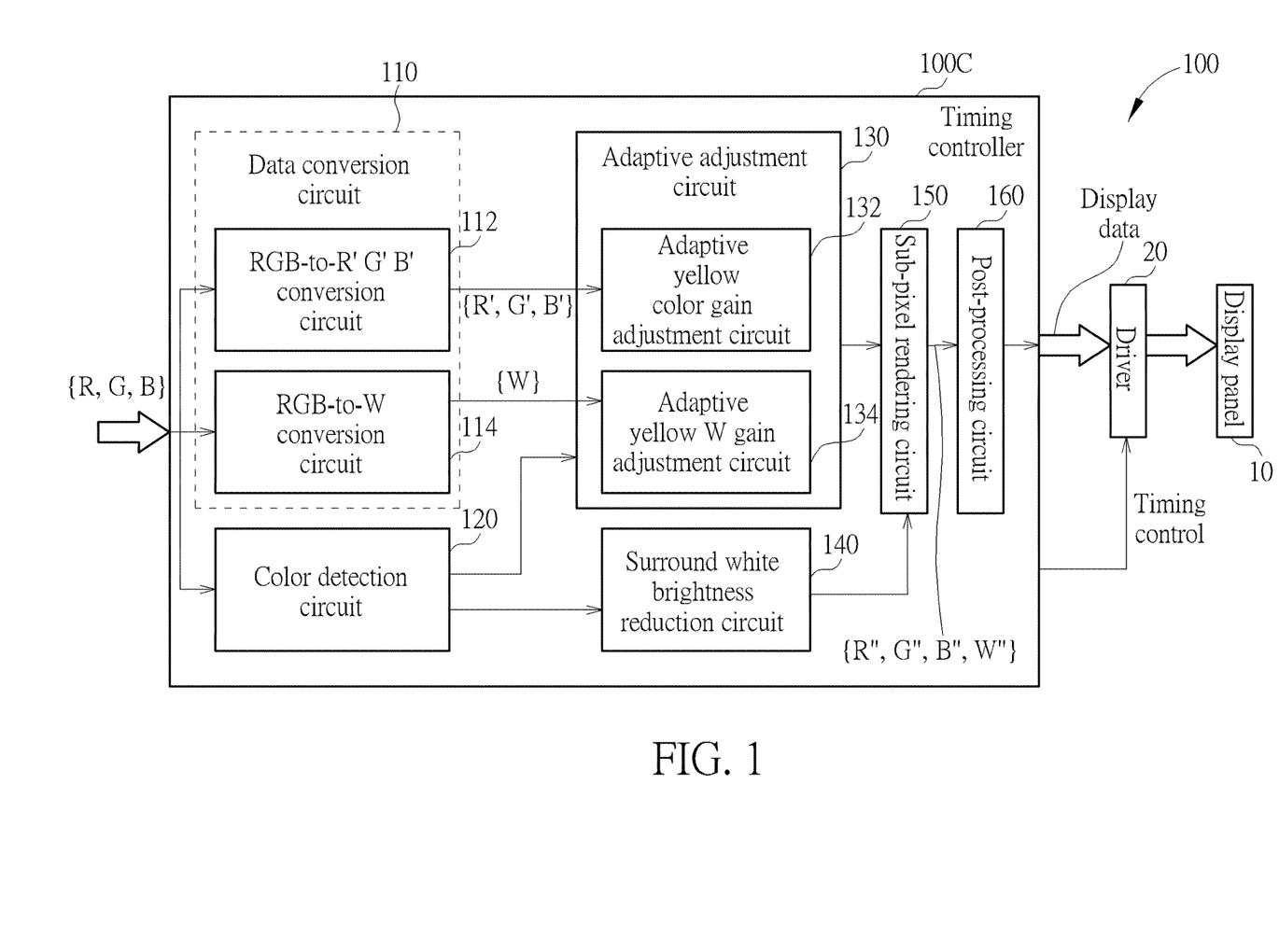
FIG. 1 is a diagram of a display system according to an embodiment of the present invention.

FIG. 1 is a diagram of a display system 100 according to an embodiment of the present invention. The display system 100 may be taken as an example of the aforementioned display system. As shown in FIG. 1, the display system 100 may comprise a display panel 10, a driver 20, and a timing controller 100C, which may be taken as examples of the aforementioned display panel, the driving circuit, and the control circuit, respectively. The display panel 10 may comprise a plurality of pixels, and the plurality of pixels may comprise red, green, blue, and white sub-pixels, and the driver 20 may comprise one or more source drivers and one or more gate drivers for driving the display panel 10. In addition, the timing controller 100C may comprise a data conversion circuit 110, a color detection circuit 120, and at least one adjustment circuit (e.g. one or more adjustment circuits), such as an adaptive adjustment circuit 130 and a surround white brightness reduction circuit 140, and may further comprise a sub-pixel rendering circuit 150 and a post-processing circuit 160, where the data conversion circuit 110 may comprise an RGB-to-R'G'B' conversion circuit 112 and an RGB-to-W conversion circuit 114, and the adaptive adjustment circuit 130 may comprise an adaptive yellow color gain adjustment circuit 132 and an adaptive yellow W (white) gain adjustment circuit 134. The timing controller 100C may receive at least one video signal such as a set of one or more video signals (depicted with an arrow around the leftmost of FIG. 1, for better comprehension) and control the display panel 10 to display images according to the set of one or more video signals, and may adaptively adjust the images when needed.

According to this embodiment, the set of one or more video signals may carry pixel data {R, G, B} of an image frame (e.g. a picture, a photograph, etc.) with the pixel data {R, G, B} corresponding to red, green, and blue color channels of the image frame, respectively, but the present invention is not limited thereto. For displaying the image frame with display panel 10, the channels may vary. For example, a set of display channels for sub-pixel rendering of the display panel 10 may comprise red, green, blue, and white display channels. The data conversion circuit 110 may be arranged to receive the set of one or more video signals to obtain the pixel data {R, G, B}, and perform at least one data conversion on the pixel data {R, G, B} to generate red, green, blue, and white display data {R', G', B', W} on the red, the green, the blue, and the white display channels, respectively. As shown in FIG. 1, the RGB-to-R'G'B' conversion circuit 112 may perform RGB-to-R'G'B' conversion on the pixel data {R, G, B} to generate the red, the green, and the blue display data {R', G', B'} on the red, the green, and the blue display channels, respectively, and the RGB-to-W conversion circuit 114 may perform RGB-to-W conversion on the pixel data {R, G, B} to generate the white display data {W} on the white display channel. For example, performing the RGB-to-R'G'B' conversion on the pixel data {R, G, B} may comprise multiplying the pixel data {R, G, B} by a set of predetermined ratios to generate the red, the green, and the blue display data {R', G', B'}, respectively, and performing the RGB-to-W conversion on the pixel data {R, G, B} may comprise calculating a linear combination of the pixel data {R, G, B} with a set of predetermined coefficients to generate the white display data {W}, but the present invention is not limited thereto.

In addition, the color detection circuit 120 may perform some detection operations to generate detection results, and may selectively trigger adjustment operations of the aforementioned at least one adjustment circuit such as the adaptive adjustment circuit 130 and the surround white brightness reduction circuit 140 according to the detection results. When needed, the color detection circuit 120 may send one or more of the detection results to any of the adaptive adjustment circuit 130 and the surround white brightness reduction circuit 140. More particularly, the color detection circuit 120 may be arranged to perform hue calculations on the pixel data {R, G, B} of the image frame to detect a yellow partial image of the image frame (e.g. a yellow block, a yellow circle, or any or various video objects of the yellow color) and detect a white partial image of the image frame (e.g. a white background, a white surrounding video object, or any of various white video objects nearby). The color detection circuit 120 may determine a distance D between the yellow partial image and the white partial image, and may compare the distance D with a predetermined distance threshold Dth to determine whether the yellow partial image and the white partial image are sufficiently close to each other. Examples of the detection results generated by the color detection circuit 120 may include, but are not limited to: the distance D, a comparison result of the comparing operation, a set of color coordinate values of the yellow partial image, a set of color coordinate values of the white partial image, a location of the yellow partial image, a location of the white partial image, a region that the yellow partial image occupies in the image frame, a region that the white partial image occupies in the image frame, and a number of sets of yellow and white partial images.

Additionally, the aforementioned at least one adjustment circuit (such as the adaptive adjustment circuit 130 and the surround white brightness reduction circuit 140) may be arranged to selectively adjust brightness of the yellow partial image and selectively adjust brightness of the white partial image. For example, when the yellow partial image and the white partial image are sufficiently close to each other, the color detection circuit 120 may trigger the aforementioned at least one adjustment circuit (e.g. at least one of the adaptive adjustment circuit 130 and the surround white brightness reduction circuit 140) to change at least one of the brightness of the yellow partial image and the brightness of the white partial image to reduce a brightness difference between the yellow partial image and the white partial image, for controlling the display panel 10 to display the yellow partial image and the white partial image with the brightness difference being reduced, to prevent generating an incorrect color related to inherent deficiency of display capability of the red, the green, the blue, and the white sub-pixels. According to this embodiment, the aforementioned at least one adjustment circuit (such as the adaptive adjustment circuit 130 and the surround white brightness reduction circuit 140) may apply the operation of changing the aforementioned at least one of the brightness of the yellow partial image and the brightness of the white partial image to at least one portion of the red, the green, the blue, and the white display data {R', G', B', W}, for generating an updated version {R'', G'', B'', W''} of the red, the green, the blue, and the white display data {R', G', B', W}. For example, the adaptive yellow color gain adjustment circuit 132 may perform adaptive yellow-content color-gain adjustment, and more particularly, may adaptively adjust the gain of the red, the green, and the blue display data {R', G', B'} of the yellow contents of the yellow partial image, to increase the brightness of the yellow partial image. For another example, the adaptive yellow W (white) gain adjustment circuit 134 may perform adaptive yellow-content white-gain adjustment, and more particularly, may adaptively adjust the gain of the white display data {W} of the yellow contents of the yellow partial image, to increase the brightness of the yellow partial image. For yet another example, the surround white brightness reduction circuit 140 may perform surround white-content brightness reduction, and more particularly, may reduce the brightness of white contents of the white partial image.

Furthermore, the sub-pixel rendering circuit 150 may be arranged to perform sub-pixel rendering to output the updated version {R'', G'', B'', W''} of the red, the green, the blue, and the white display data {R', G', B', W} to the post-processing circuit 160, for the post-processing circuit 160 to perform post-processing on the updated version {R'', G'', B'', W''} to generate the associated post-processing results, and the timing controller 100C may utilize the post-processing results as the display data for being output toward the driver 20, and may control the display panel 10 through the driver 20, in order to display the display data, where the timing controller 100C (e.g. a timing control circuit therein) may perform timing control on the driver 20, but the present invention is not limited thereto. According to some embodiments, one or more other circuits such as additional adjustment circuits may be added into the architecture shown in FIG. 1, and may be arranged to perform other processing such as other adjustment. According to some embodiments, the timing controller 100C may comprise a data processing circuit, and the data processing circuit may comprise the data conversion circuit 110, the color detection circuit 120, the aforementioned at least one adjustment circuit such as the adaptive adjustment circuit 130 and the surround white brightness reduction circuit 140, the sub-pixel rendering circuit 150, and the post-processing circuit 160, but the present invention is not limited thereto.

Based on the architecture shown in FIG. 1, the timing controller 100C that operates according to the method can properly control the display panel 10 to display various types of video contents while suppressing or eliminating observable chromatic defect such as the yellow color greenish effect. Therefore, the present invention method and apparatus can guarantee the overall performance of the display system 100.

Figure 2:
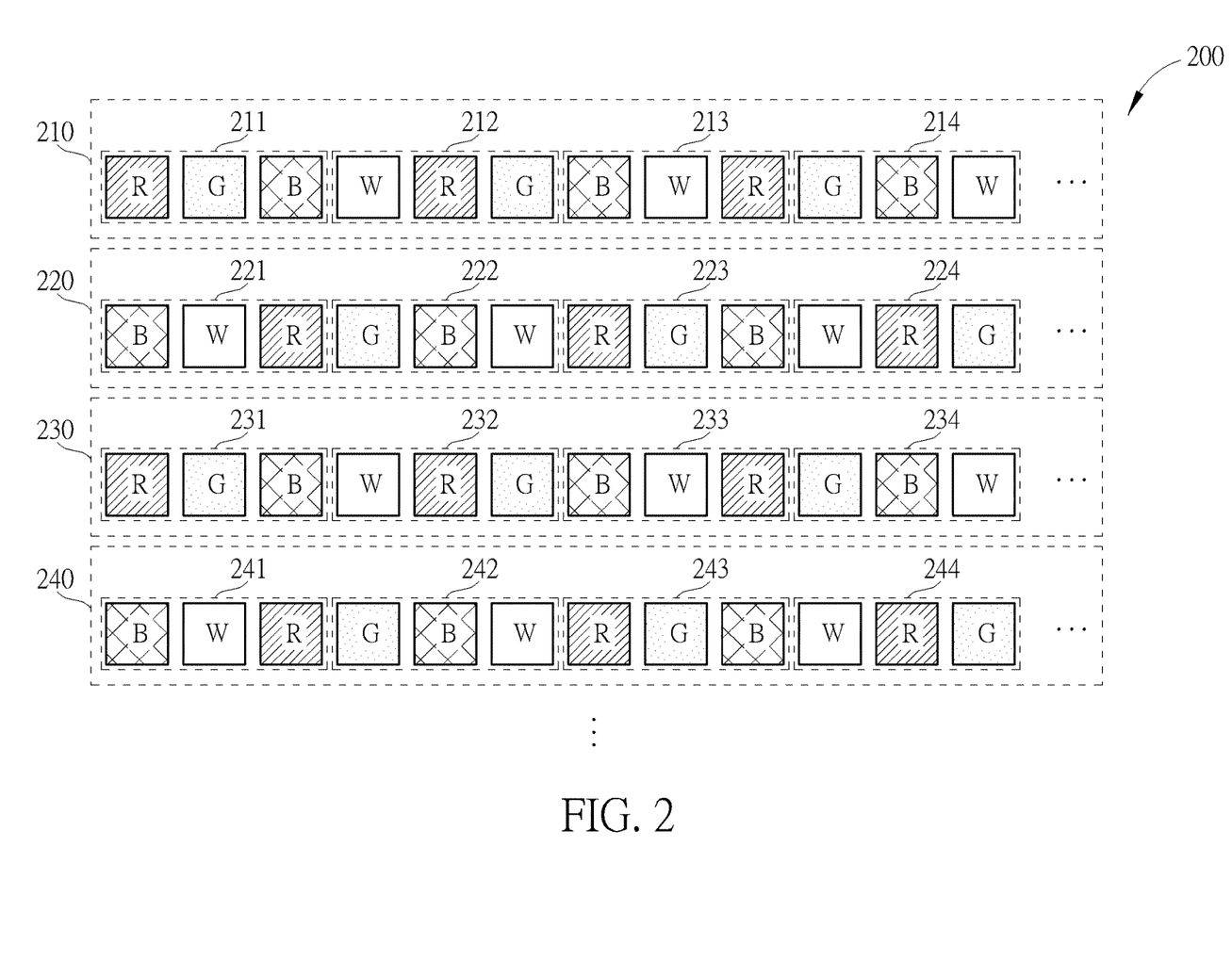
FIG. 2 illustrates sub-pixel arrangement of the display panel shown in FIG. 1 according to an embodiment of the present invention.

FIG. 2 illustrates sub-pixel arrangement 200 of the display panel 10 shown in FIG. 1 according to an embodiment of the present invention. For example, the plurality of pixels of the display panel 10 may comprise multiple rows of pixels, such as the pixels {211, 212, 213, 214, . . . } of the first row 210, the pixels {221, 222, 223, 224, . . . } of the second row 220, the pixels {231, 232, 233, 234, . . . } of the third row 230, the pixels {241, 242, 243, 244, . . . } of the fourth row 240, etc. According to this embodiment, any of the plurality of pixels may comprise at least three of a red sub-pixel, a green sub-pixel, a blue sub-pixel, and a white sub-pixel, but the present invention is not limited thereto. For better comprehension, the sub-pixels of the pixels shown in FIG. 2 are labeled with R, G, B, and W to indicate that they are red, green, blue, and white sub-pixels, respectively. For example, the pixel 211 may comprise a red sub-pixel, a green sub-pixel, and a blue sub-pixel, the pixel 212 may comprise a white sub-pixel, a red sub-pixel, and a green sub-pixel, the pixel 213 may comprise a blue sub-pixel, a white sub-pixel, and a red sub-pixel, and the pixel 214 may comprise a green sub-pixel, a blue sub-pixel, and a white sub-pixel. According to some embodiments, the sub-pixel arrangement 200 may vary.

Figure 3:
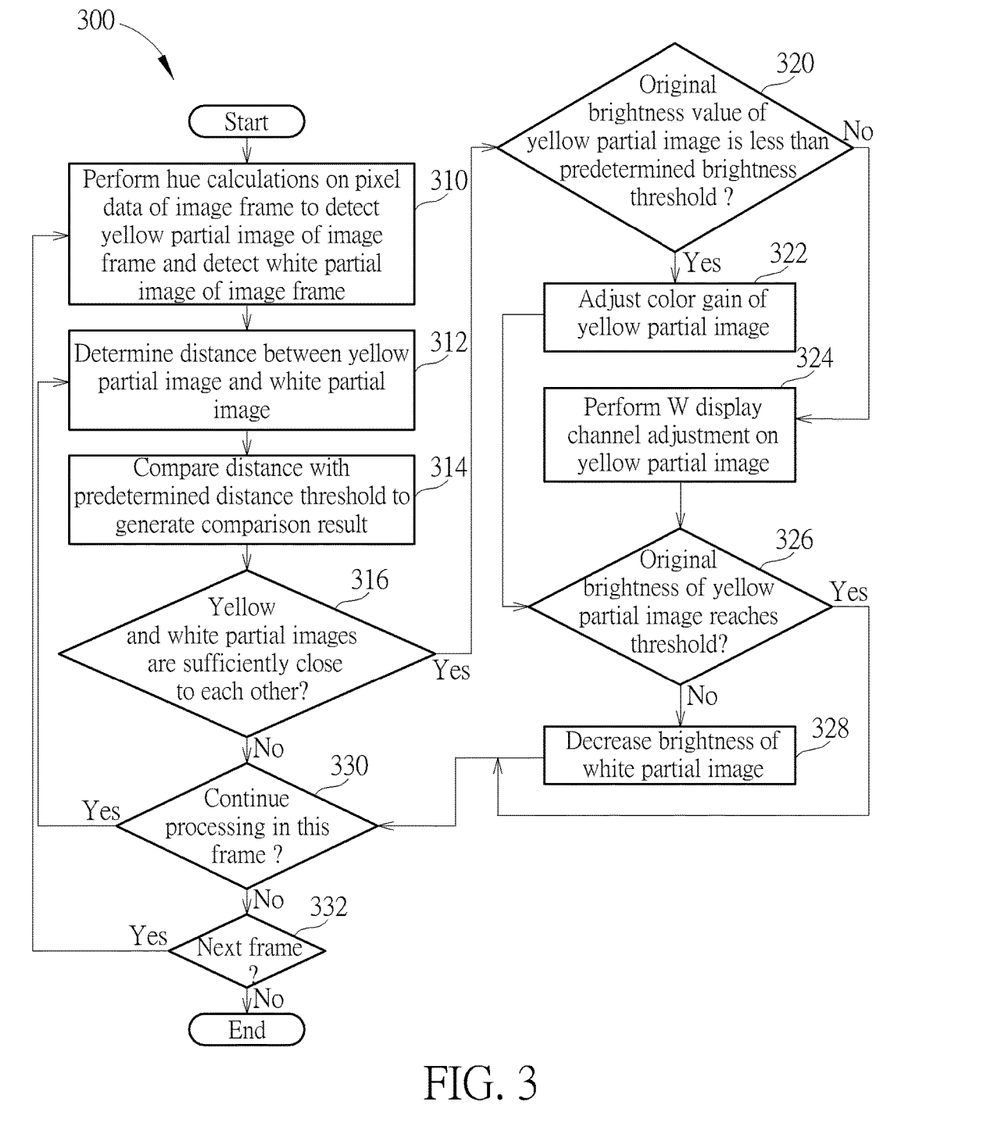
FIG. 3 is a flowchart of a method for performing display control of a display panel according to an embodiment of the present invention.

FIG. 3 is a flowchart of a method 300 for performing display control of a display panel (e.g. the display panel 10 shown in FIG. 1) according to an embodiment of the present invention, where the method 300 can be taken as an example of the aforementioned method. The method 300 can be applied to the display system 100 and the timing controller 100C. According to this embodiment, the image frame may represent any of a plurality of image frames, which may be referred to as the frames, for brevity. For each of the frames (e.g. the image frame), changing the aforementioned at least one of the brightness of the yellow partial image and the brightness of the white partial image may comprise at least one of:

(ADJ1). increasing the brightness of the yellow partial image (e.g. one or both of the operations of Step 322 and Step 324); and (ADJ2). decreasing the brightness of the white partial image (e.g. the operation of Step 328);

where the timing controller 100C may perform various detections to determine whether to perform one or more of the adjustment operations (ADJ1) and (ADJ2) and/or determine how to perform one or more of the adjustment operations (ADJ1) and (ADJ2). Regarding the adjustment operations (ADJ1), when the original brightness value of the yellow partial image on the red, the green, and the blue display channels (e.g. a gray level obtained from a function L(R', G', B'), such as L(R', G', B')=(Rr*R')+(Gr*G')+(Br*B'), where Rr, Gr, and Br may represent predetermined coefficients, respectively) is less than a predetermined brightness threshold (e.g. a predetermined gray level), the adaptive adjustment circuit 130 may increase the brightness of the yellow partial image on the red, the green, and the blue display channels (e.g. the operation of Step 322). In addition, when the original brightness value of the yellow partial image on the red, the green, and the blue display channels (e.g. the gray level obtained from the function L(R', G', B')) is greater than the predetermined brightness threshold (e.g. the predetermined gray level), the adaptive adjustment circuit 130 may increase the brightness of the yellow partial image on the white display channel (e.g. the operation of Step 324). Regarding the adjustment operations (ADJ2), when the original brightness value of the yellow partial image on the red, the green, and the blue display channels (e.g. the gray level obtained from the function L(R', G', B')) is less than a product of a predetermined ratio and an original brightness value of the white partial image on the white display channel (e.g. the product (Ratio*W), where Ratio may represent the predetermined ratio, and the white display data W of the white partial image may represent the original brightness value of the white partial image), the surround white brightness reduction circuit 140 may decrease the brightness of the white partial image on the white display channel (e.g. the operation of Step 328).

In Step 310, the color detection circuit 120 may perform hue calculations on the pixel data {R, G, B} of an image frame such as that mentioned above to detect the yellow partial image of the image frame and detect the white partial image of image frame.

In Step 312, the color detection circuit 120 may determine the distance D between the yellow partial image and the white partial image.

In Step 314, the color detection circuit 120 may compare the distance D with the predetermined distance threshold Dth to generate a comparison result. For example, the distance D may represent the size of a gap between the yellow partial image and the white partial image and the predetermined distance threshold Dth may represent a predetermined gap-size threshold, but the present invention is not limited thereto.

In Step 316, according to the comparison result of Step 314, the color detection circuit 120 may check whether the yellow and the white partial images are sufficiently close to each other. For example, when the distance D is less than the predetermined distance threshold Dth, the color detection circuit 120 may determine that the yellow and the white partial images are sufficiently close to each other. For another example, when the distance D is less than or equal to the predetermined distance threshold Dth, the color detection circuit 120 may determine that the yellow and the white partial images are sufficiently close to each other. As shown in FIG. 3, when the yellow and the white partial images are sufficiently close to each other, Step 320 is entered; otherwise Step 330 is entered.

In Step 320, according to the red, the green, and the blue display data {R', G', B'} of the yellow partial image, the adaptive adjustment circuit 130 may check whether the original brightness value of the yellow partial image (e.g. the gray level obtained from the function L(R', G', B')) is less than the predetermined brightness threshold (e.g. the predetermined gray level). When the original brightness value of the yellow partial image (e.g. the gray level obtained from the function L (R', G', B')) is less than the predetermined brightness threshold (e.g. the predetermined gray level), Step 322 is entered; otherwise, Step 324 is entered.

In Step 322, the adaptive adjustment circuit 130 (more particularly, the adaptive yellow color gain adjustment circuit 132) may adjust the color gain (e.g. the gain on the red, the green, and the blue display channels, such as that of the red, the green, and the blue display data {R', G', B'}) of the yellow partial image, to increase the brightness of the yellow partial image.

In Step 324, the adaptive adjustment circuit 130 (more particularly, the adaptive yellow W gain adjustment circuit 134) may perform white (W) display channel adjustment (e.g. data adjustment on the white display channel, such as that of the white display data {W}) on the yellow partial image, to increase the brightness of the yellow partial image on the white display channel, but the present invention is not limited thereto. For example, in Step 324, the adaptive adjustment circuit 130 (more particularly, the adaptive yellow color gain adjustment circuit 132) may perform an operation similar to that of Step 322, to adjust the color gain of the yellow partial image to be as high as possible, in order to fully utilize the display capability of the red, the green, and the blue display channels, where some implementation details will be described later (e.g. examples of Tables 2 and 3).

In Step 326, the surround white brightness reduction circuit 140 may check whether the original brightness of the yellow partial image (e.g. the gray level obtained from the function L(R', G', B')) reaches a threshold (e.g. the product (Ratio*W)). For example, the surround white brightness reduction circuit 140 may obtain the original brightness of the yellow partial image from the adaptive adjustment circuit 130, or may obtain the original brightness of the yellow partial image by itself through the function L (R', G', B'). When the original brightness of the yellow partial image reaches the threshold, Step 330 is entered; otherwise, Step 328 is entered.

In Step 328, the surround white brightness reduction circuit 140 may decrease the brightness of the white partial image. For example, the surround white brightness reduction circuit 140 may adjust the W gain (e.g. the gain on the W display channel) of the white partial image, to decrease the brightness of the white partial image.

In Step 330, according to at least one of the detection results generated by the color detection circuit 120 (e.g. the location of the yellow partial image, the location of the white partial image, the number of sets of yellow and white partial images, etc.), the timing controller 100C may determine whether to continue processing in this frame (e.g. the image frame). When the timing controller 100C determines to continue processing in this frame, for example, in a situation where at least one set of the sets of yellow and white partial images has not been processed in a similar manner as that of the operations of Step 310 through to Step 328, Step 312 is entered to process the next set of yellow and white partial images in this frame; otherwise, Step 332 is entered.

In Step 332, according to the set of one or more video signals, the timing controller 100C may determine whether a next frame exists. When the next frame exists, Step 310 is entered; otherwise, the working flow shown in FIG. 3 comes to the end.

According to this embodiment, when the yellow partial image and the white partial image are sufficiently close to each other (e.g. D<Dth, or D≤Dth), the color detection circuit 120 may trigger the aforementioned at least one adjustment circuit (such as the adaptive adjustment circuit 130 and the surround white brightness reduction circuit 140) to change the aforementioned at least one of the brightness of the yellow partial image and the brightness of the white partial image to reduce the brightness difference between the yellow partial image and the white partial image, in order to eliminate a greenish effect of the display panel 10 regarding the yellow partial image. This is for illustrative purposes only, and is not meant to be a limitation of the present invention. According to some embodiments, the working flow shown in FIG. 3 may vary. For example, one or more steps may be altered, added, or deleted in the working flow shown in FIG. 3. For another example, the order of some steps in the working flow shown in FIG. 3 may vary.

According to some embodiments, the color detection circuit 120 may allow a predetermined range of color drift and/or a predetermined range of brightness drift when determine the colors of various partial images in the image frame (e.g. the yellow and the white partial images). For example, some calculation results of the hue calculations may indicate that the contents of the yellow partial image comprise a predetermined range of hue, wherein the predetermined range of hue may comprise hue corresponding to the yellow color. Thus, the color detection circuit 120 may allow the yellow partial image to be pure yellow or yellow with a slight color drift. For another example, some calculation results of the hue calculations may indicate that the contents of the white partial image comprise at least one of a set of natural colors, wherein the set of natural colors may comprise white and gray (e.g. any of multiple gray levels). Thus, the color detection circuit 120 may allow the white partial image to be pure white or white with a slight brightness drift.

Figure 4:
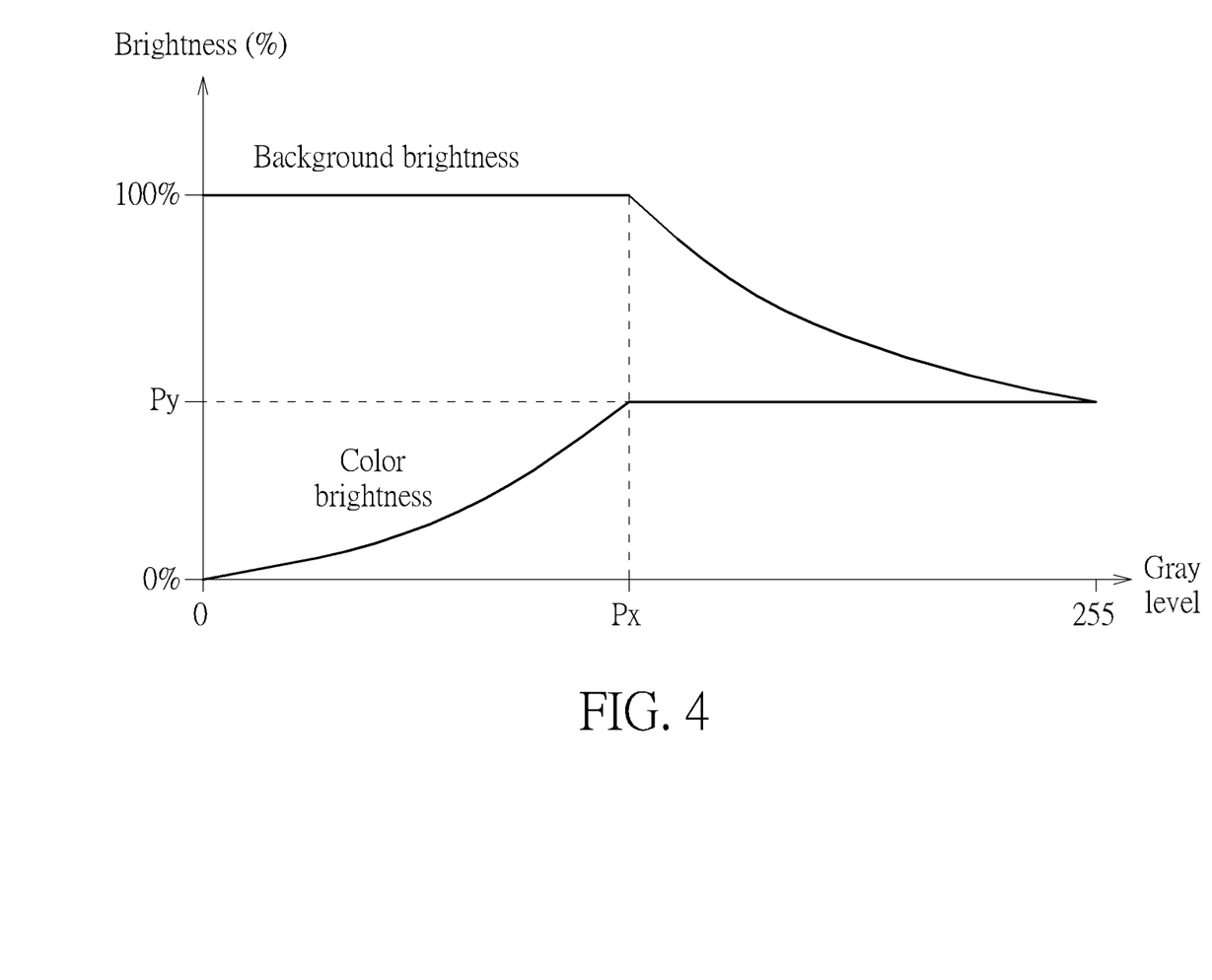
FIG. 4 illustrates a brightness adjustment control scheme of the method shown in FIG. 3 according to an embodiment of the present invention.

FIG. 4 illustrates a brightness adjustment control scheme of the method 300 shown in FIG. 3 according to an embodiment of the present invention. The lower curve and the upper curve shown in FIG. 4 may be taken as examples of the adjustment operations (ADJ1) and (ADJ2), respectively, where the horizontal axis may represent the original brightness value of the yellow partial image on the red, the green, and the blue display channels, such as the gray level obtained from the function L(R', G', B'), and the vertical axis may represent the brightness percentage (labeled "Brightness (%)" in FIG. 4, for better comprehension). According to the lower curve with transition at the point (Px, Py), the color brightness such as the brightness of the yellow partial image may be enhanced in the interval [0, Px] and may reach a maximum such as that corresponding to Py in the interval [Px, 255] due to one or more reasons (e.g. the design of the display system 100, such as that of the display panel 10), but the present invention is not limited thereto. In some examples, the lower curve corresponding to the adjustment operations (ADJ1) may vary. According to the upper curve with transition at the point (Px, 100%), the background brightness (or the surround brightness) such as the brightness of the white partial image may be kept unchanged in the interval [0, Px] and may be reduced in the interval [Px, 255], but the present invention is not limited thereto. In some examples, the upper curve corresponding to the adjustment operations (ADJ2) may vary.

According to some embodiments, in the frames mentioned above, one frame may comprise a person wearing a yellow cloth waking on the snowy ground, another frame may comprise flowers with yellow and white colors, and yet another frame may comprise a cheese sandwich in which the cheese is yellow and the slices of bread are white. In order to achieve sufficient color or brightness when controlling the display panel 10 to display the yellow partial image (e.g. the person in yellow, etc.) and the white partial image (e.g. the snowy ground, etc.) that are close to each other, the timing controller 100C may selectively perform one or more of the adjustment operations (ADJ1) and (ADJ2), frame by frame, where the adjustment operations (ADJ1) may increase the yellow color brightness (e.g. the color brightness such as the brightness of the yellow partial image) and the adjustment operations (ADJ2) may decrease the surround white brightness (e.g. the background or surround brightness such as the brightness of the white partial image).

Figure 5:
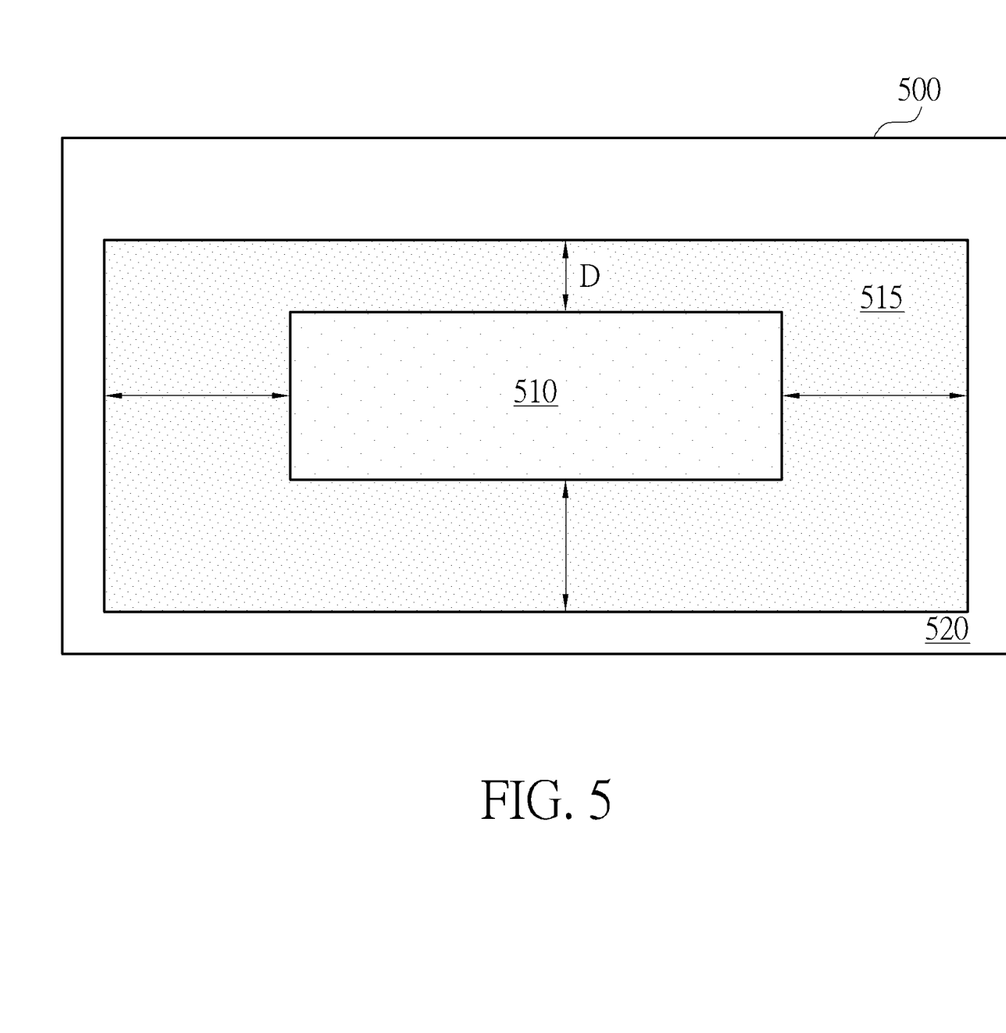
FIG. 5 illustrates an adjustment trigger control scheme of the method shown in FIG. 3 according to an embodiment of the present invention.

FIG. 5 illustrates an adjustment trigger control scheme of the method 300 shown in FIG. 3 according to an embodiment of the present invention. The image frame 500 shown in FIG. 5 may be taken as an example of the image frame mentioned in Step 310, and the partial images 510 and 520 of the frame 500 may be taken as examples of the yellow partial image and the white partial image, respectively, where the partial image 515 may separate the partial images 510 and 520. For example, the color detection circuit 120 may determine various distances between the yellow partial image and the white partial image and may select the minimum of these distances as the distance D.

According to this embodiment, the color detection circuit 120 may calculate a set of color coordinate values such as the Hue (h) and the Value (v) of the HSV (which may stand for hue, saturation, and value) coordinate system according to the pixel data {R, G, B}, to detect the yellow color (e.g. the yellow partial image) and the surround white (e.g. the white partial image), where the Value (v) may be regarded as a representation of brightness. With aid of the hue calculations, the color detection circuit 120 may define the surround white and yellow color distance such as the distance D. As a result, the surround white brightness reduction circuit 140 may decrease the surround white brightness in a gradient descent manner according to a yellow color-to-white brightness proportion YWR (e.g. a ratio of the original brightness of the yellow partial image to the original brightness of the white partial image), but the present invention is not limited thereto. An example of the calculations regarding the Hue (h) and the Value (v) may be expressed as follows:

$$h = \begin{cases} 0° & \text{if max = min} \\ 60° \times \frac{g-b}{\max - \min} + 0°, & \text{if max = } r \text{ and } g \geq b \\ 60° \times \frac{g-b}{\max - \min} + 360°, & \text{if max = } r \text{ and } g < b \\ 60° \times \frac{b-r}{\max - \min} + 120°, & \text{if max = } g \\ 60° \times \frac{r-g}{\max - \min} + 240°, & \text{if max = } b \end{cases}$$

$$v = \max(r, g, b);$$

where r, g, and b may represent a subset of the pixel data {R, G, B}, such as that corresponding to a pixel in the image frame, and max and min may represent the maximum and the minimum of the pixel data {r, g, b}, respectively, but the present invention is not limited thereto.

TABLE 1

| YWR | W Gain |
| --- | --- |
| 0.5 | 0.375 |
| 0.55 | 0.4125 |
| 0.6 | 0.45 |
| 0.65 | 0.4875 |
| 0.7 | 0.525 |
| 0.75 | 0.5625 |
| 0.8 | 0.6 |
| 0.85 | 0.6375 |
| 0.9 | 0.675 |
| 0.95 | 0.7125 |
| 1 | 0.75 |

According to some embodiments, the surround white brightness reduction circuit 140 may decrease the surround white brightness by using table mapping. Table 1 illustrates an example of the table mapping corresponding to the relationship between the yellow color-to-white brightness proportion YWR and the W gain of the white partial image, but the present invention is not limited thereto. In some examples, the table contents in one or more of the fields "YWR" and "W Gain" of Table 1 may vary. In some examples, the surround white brightness reduction circuit 140 may perform interpolation operations to obtain more mapping data sets of the relationship between the yellow color-to-white brightness proportion YWR and the W gain of the white partial image.

According to some embodiments, in Step 328, the surround white brightness reduction circuit 140 may obtain the yellow color-to-white brightness proportion YWR from the color detection circuit 120, and may decrease the brightness of the white partial image by applying the table mapping to the white display data {W} of the white partial image to generate the updated version {W"} thereof as follows:

$$W''=\text{Gain}(YWR)*W;$$

where the function Gain (YWR) may represent the table mapping corresponding to Table 1, but the present invention is not limited thereto. For example, in Step 324, the adaptive yellow W gain adjustment circuit 134 may perform the W display channel adjustment on the yellow partial image, rather than the white partial image, so the white display data {W} of the white partial image has not been changed by the adaptive yellow W gain adjustment circuit 134. When Step 328 is entered, the surround white brightness reduction circuit 140 may decrease the brightness of the white partial image by applying the table mapping corresponding to Table 1 to the white display data {W} of the white partial image to generate the updated version {W"} thereof. According to some embodiments, in Step 328, the surround white brightness reduction circuit 140 may calculate the yellow color-to-white brightness proportion YWR by itself.

According to some embodiments, the adjustment for the white partial image and the associated control may be express with the following pseudo code:

```
{
If ( D <= Dth )
    If ( L(R', G', B') >= Ratio * WHITE_W );
        WHITE_W' = WHITE_W;
    else
        WHITE_W' = LUT(YWR) * WHITE_W;
    end
end
}
``` where $WHITE_W$ may represent the original brightness of the white partial image (e.g. the white display data W of the white partial image), the function LUT( ) may represent the table mapping based on the fields "YWR" and "W Gain" of Table 1, and $WHITE_W'$ may represent the corresponding mapping result (e.g. the adjusted white display data W" of the white partial image) when "$WHITE_W'$=LUT (YWR) *$WHITE_W$" shown above is executed or represent the unchanged result when "$WHITE_W'$=$WHITE_W$" shown above is executed. For brevity, similar descriptions for these embodiments are not repeated in detail here.

Figure 6:
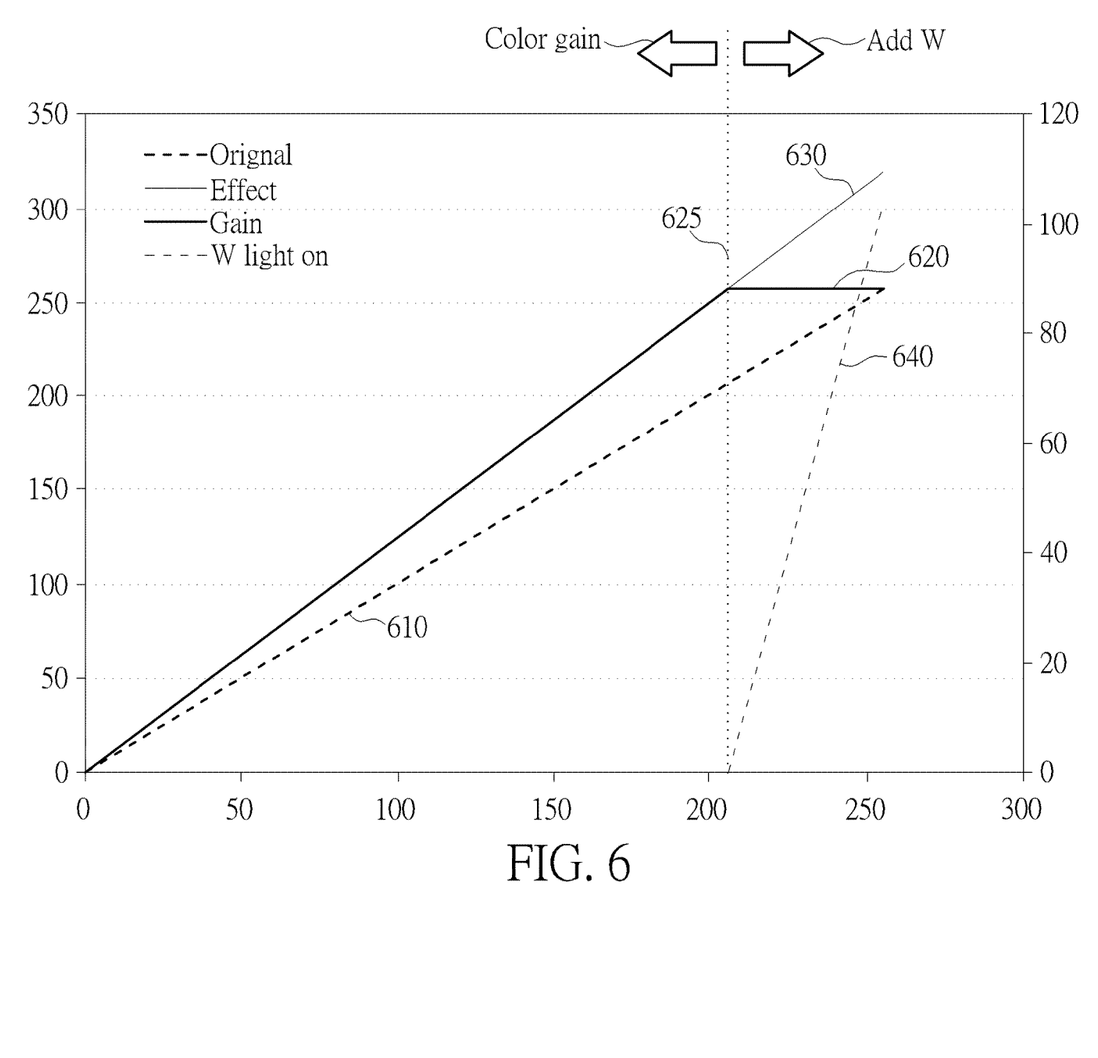
FIG. 6 illustrates a hybrid brightness enhancement control scheme of the method shown in FIG. 3 according to an embodiment of the present invention.

FIG. 6 illustrates a hybrid brightness enhancement control scheme of the method 300 shown in FIG. 3 according to an embodiment of the present invention. The horizontal axis shown in FIG. 6 may represent the original brightness value of the yellow partial image on the red, the green, and the blue display channels, such as the gray level obtained from the function L(R', G', B'), and the vertical axis may have similar meanings for the curve 610 corresponding to the legend "Original" since the curve 610 maps a value on the horizontal axis to the same value on the vertical axis. In addition, the curve 625 may represent the predetermined brightness threshold (e.g. the predetermined gray level). As shown in FIG. 6, the curve 620 corresponding to the legend "Gain" and the curve 630 corresponding to the legend "Effect" may start from the origin point (0, 0) with a common partial curve thereof (e.g. the partial curve at the left-hand side of the dashed line 625) splitting into two partial curves at the right-hand side of the dashed line 625, and the curve 640 corresponding to the legend "W light on" may start from the intersection of the dashed line 625 and the horizontal axis. The curve 620 may represent adjusting the color gain of the yellow partial image to increase the brightness of the yellow partial image on the red, the green, and the blue display channels (e.g. the operation of Step 322), where the curve 620 may turn flat (e.g. reach the maximum thereof) at the right-hand side of the dashed line 625 due to one or more reasons (e.g. limitation of the display capability of the red, the green, and the blue display channels). The curve 640 may represent performing the W display channel adjustment on the yellow partial image (e.g. the operation of Step 324). Please note that, although the curve 620 may turn flat (e.g. reach the maximum thereof), the adjustment corresponding to the curve 640 may further increase the brightness of the yellow partial image. The curve 630 may represent the resultant effect of both of the adjustment corresponding to the curve 620 and the adjustment corresponding to the curve 640, and the resultant brightness of the yellow partial image may exceed the value 255 on the vertical axis. Therefore, based on the hybrid brightness enhancement control scheme, regarding increasing the brightness of the yellow partial image, the adaptive adjustment circuit 130 may rely on adjusting the color gain of the yellow partial image when the gray level obtained from the function L (R', G', B') is less than the predetermined gray level, and may mainly rely on the W display channel adjustment (labeled "Add W" in FIG. 6, for better comprehension) of the yellow partial image when the gray level obtained from the function L(R', G', B') is greater than the predetermined gray level to further increase the brightness, but the present invention is not limited thereto. For example, the adaptive adjustment circuit 130 may rely on adjusting the color gain of the yellow partial image when the gray level obtained from the function L(R', G', B') is less than the predetermined gray level, and may mainly rely on the W display channel adjustment of the yellow partial image when the gray level obtained from the function L(R', G', B') reaches (e.g. is greater than or equal to) the predetermined gray level to further increase the brightness. In another example, the adaptive adjustment circuit 130 may rely on adjusting the color gain of the yellow partial image when the gray level obtained from the function L(R', G', B') is less than or equal to the predetermined gray level, and may mainly rely on the W display channel adjustment of the yellow partial image when the gray level obtained from the function L(R', G', B') is greater than the predetermined gray level to further increase the brightness.

TABLE 2

| Yellow Gray | Output Yellow Gray | Reference |
|---|---|---|
| 0 | 0 | 0 |
| 1 | 1 | 1.25 |

TABLE 2-continued

| Yellow Gray | Output Yellow Gray | Reference |
|---|---|---|
| 2 | 3 | 2.5 |
| 3 | 4 | 3.75 |
| 4 | 5 | 5 |
| 5 | 6 | 6.25 |
| 6 | 8 | 7.5 |
| 7 | 9 | 8.75 |
| 8 | 10 | 10 |
| ... | ... | ... |
| 193 | 241 | 241.25 |
| 194 | 243 | 242.5 |
| 195 | 244 | 243.75 |
| 196 | 245 | 245 |
| 197 | 246 | 246.25 |
| 198 | 248 | 247.5 |
| 199 | 249 | 248.75 |
| 200 | 250 | 250 |
| 201 | 251 | 251.25 |
| 202 | 253 | 252.5 |
| 203 | 254 | 253.75 |
| 204 | 255 | 255 |
| 205 | 255 | 256.25 |
| ... | ... | ... |
| 255 | 255 | 318.75 |

According to some embodiments, the adaptive adjustment circuit 130 may adjust the color gain of the yellow partial image by using table mapping. Table 2 illustrates an example of the table mapping corresponding to the curve 620, where the notation " . . . " may indicate that some table contents of Table 2 have been omitted, for brevity, the fields "Yellow Gray" and "Output Yellow Gray" of Table 2 may correspond to the horizontal axis and the vertical axis shown in FIG. 6, respectively, but the present invention is not limited thereto. In some examples, the table contents in one or more of the fields "Yellow Gray" and "Output Yellow Gray" of Table 2 may vary. The table contents in the field "Yellow Gray" of Table 2 can be taken as examples of the gray level obtained from the function L(R', G', B'), and the table contents in the field "Output Yellow Gray" of Table 2 can be taken as examples of the adjustment result (e.g. the adjusted gray level) of adjusting the color gain of the yellow partial image.

For better comprehension, an additional field "Reference" may be further illustrated. The field "Reference" may represent a set of ideal gray levels obtained from applying a predetermined gain (e.g. 1.25) to the field "Yellow Gray" and can be utilized for generating a portion of the table contents in the field "Output Yellow Gray" (e.g. the values that are less than 255), for example, through a function Round( ) that may round a number to a specified number of digits.

TABLE 3

| Yellow Gray | Yellow Gain |
|---|---|
| 0 | 1.25 |
| 1 | 1.25 |
| 2 | 1.25 |
| ... | ... |
| 204 | 1.25 |
| 205 | 1.243902439 |
| 206 | 1.237864078 |
| 207 | 1.231884058 |
| 208 | 1.225961538 |
| 209 | 1.220095694 |
| 210 | 1.214285714 |
| 211 | 1.208530806 |
| 212 | 1.202830189 |

TABLE 3-continued

| Yellow Gray | Yellow Gain |
|---|---|
| 213 | 1.197183099 |
| 214 | 1.191588785 |
| 215 | 1.186046512 |
| ... | ... |
| 245 | 1.040816327 |
| 246 | 1.036585366 |
| 247 | 1.032388664 |
| 248 | 1.028225806 |
| 249 | 1.024096386 |
| 250 | 1.02 |
| 251 | 1.015936255 |
| 252 | 1.011904762 |
| 253 | 1.007905138 |
| 254 | 1.003937008 |
| 255 | 1 |

Table 3 illustrates an example of the table mapping corresponding to the relationship between the original brightness of the yellow partial image (e.g. the gray level obtained from the function L (R', G', B')) and the color gain (e.g. the gain on the red, the green, and the blue display channels, such as that of the red, the green, and the blue display data {R', G',}) of the yellow partial image, where the notation " . . . " may indicate that some table contents of Table 3 have been omitted, for brevity, and the fields "Yellow Gray" and "Yellow Gain" of Table 3 may correspond to the horizontal axis shown in FIG. 6 and the gain for the curve 620 shown in FIG. 6 (e.g. the gain function of the curve 620), respectively, but the present invention is not limited thereto. In some examples, the table contents in one or more of the fields "Yellow Gray" and "Yellow Gain" of Table 3 may vary. The table contents in the field "Yellow Gray" of Table 3 can be taken as examples of the gray level obtained from the function L (R', G', B'), and the table contents in the field "Yellow Gain" of Table 3 can be taken as examples of the color gain of the yellow partial image.

According to some embodiments, in Step 324, the adaptive adjustment circuit 130 (more particularly, the adaptive yellow color gain adjustment circuit 132) may perform the operation similar to that of Step 322, to adjust the color gain of the yellow partial image to be a maximum applicable color gain (e.g. a portion of table contents in the field "Yellow Gain" of Table 3, such as 1.243902439, 1.237864078, etc.) corresponding to the original brightness value of the yellow partial image on the red, the green, and the blue display channels (e.g. the corresponding table contents in the field "Yellow Gray" of Table 3, such as the gray levels of 205, 206, etc.), in order to convert the gray level obtained from the function L (R', G', B') into a maximum gray level (e.g. the gray level of 255).

TABLE 4

| Yellow Gray | W Gain | W Shift |
|---|---|---|
| 0 | 0 | 0 |
| 1 | 0 | 0 |
| ... | ... | ... |
| 204 | 0 | 0 |
| 205 | 0.1 | 1 |
| 206 | 0.108 | 2 |
| 207 | 0.116 | 3 |
| 208 | 0.124 | 4 |
| 209 | 0.132 | 5 |
| 210 | 0.14 | 6 |
| 211 | 0.148 | 7 |
| 212 | 0.156 | 8 |

TABLE 4-continued

| Yellow Gray | W Gain | W Shift |
|---|---|---|
| 213 | 0.164 | 9 |
| 214 | 0.172 | 10 |
| ... | ... | ... |
| 254 | 0.492 | 50 |
| 255 | 0.5 | 51 |

Table 4 illustrates an example of the table mapping corresponding to the curve 640, where the notation " . . . " may indicate that some table contents of Table 4 have been omitted, for brevity, the field "Yellow Gray" of Table 4 may correspond to the horizontal axis shown in FIG. 6, and the fields "W gain" and "W Shift" of Table 4 may correspond to some features of the curve 640, respectively, but the present invention is not limited thereto. In some examples, the table contents in one or more of these fields of Table 4 may vary.

According to some embodiments, the adjustment corresponding to the curve 620 for the yellow partial image may be express with the following pseudo code:

```
{
    YELLOW_{R'G'B'}' = ColorGain_LUT(YELLOW_{R'G'B'})
        * YELLOW_{R'G'B'};
}
``` where $YELLOW_{R'G'B'}$ may represent the gray level obtained from the function L(R'G'B') for the yellow partial image, such as the table contents in the field "Yellow Gray" of Table 3, the function ColorGain_LUT( ) may represent the table mapping based on the fields "Yellow Gray" and "Yellow Gain" of Table 3, ColorGain_LUT($YELLOW_{R'G'B'}$) may represent the mapping result (e.g. the adjusted color gain), and $YELLOW_{R'G'B'}'$ may represent the corresponding adjustment result. For example, the adjustment circuit may apply the same gain obtained in this table mapping (e.g. the adjusted color gain) to the red, the green, and the blue display data {R', G', B'} of the yellow partial image to generate the updated version {R", G", B"} thereof, respectively, but the present invention is not limited thereto. For better comprehension, the table mapping and the associated adjustment may be described as follows:
when $YELLOW_{R'G'B'}$ (e.g. "Yellow Gray" of Table 3) is equal to 0, i.e. $YELLOW_{R'G'B'}$=0, the mapping result (e.g. "Yellow Gain" of Table 3) is 1.25 and $YELLOW_{R'G'B'}'$=1.25*0=0;
when $YELLOW_{R'G'B'}$=1, the mapping result is 1.25 and $YELLOW_{R'G'B'}'$=1.25*1≅1;
when $YELLOW_{R'G'B'}$=2, the mapping result is 1.25 and $YELLOW_{R'G'B'}'$=1.25*2≅3;
. . .
when $YELLOW_{R'G'B'}$=204, the mapping result is 1.25 and $YELLOW_{R'G'B'}'$=1.25*204=255;
when $YELLOW_{R'G'B'}$=205, the mapping result is 1.243902439 and $YELLOW_{R'G'B'}'$=1.243902439*205≅255;
when $YELLOW_{R'G'B'}$=254, the mapping result is 1.003937008 and $YELLOW_{R'G'B'}'$=1.003937008*254≅255; and
when $YELLOW_{R'G'B'}$=255, the mapping result is 1 and $YELLOW_{R'G'B'}'$=1*255=255;
but the present invention is not limited thereto. In addition, the adjustment corresponding to the curve 640 for the yellow partial image may be express with the following pseudo code:

```
{
    YELLOW_W' = W_gain_LUT(YELLOW_{R'G'B'})
        * YELLOW_W
        + W_shift_LUT(YELLOW_{R'G'B'});
}
``` where $YELLOW_{R'G'B'}$ may represent the gray level obtained from the function L(R'G'B') for the yellow partial image, such as the table contents in the field "Yellow Gray" of Table 4, $YELLOW_W$ may represent the white display data W of the yellow partial image, the function W_gain_LUT( ) may represent the table mapping based on the fields "Yellow Gray" and "W Gain" of Table 4, the function W_shift_LUT ( ) may represent the table mapping based on the fields "Yellow Gray" and "W Shift" of Table 4, W_gain_LUT ($YELLOW_{R'G'B'}$) and W_shift_LUT ($YELLOW_{R'G'B'}$) may represent the mapping results, respectively, and $YELLOW_W'$ may represent the corresponding adjustment result (e.g. the adjusted white display data W" of the yellow partial image). For better comprehension, the table mapping and the associated adjustment may be described as follows:
when $YELLOW_{R'G'B'}$ (e.g. "Yellow Gray" of Table 4) is equal to 0, i.e. $YELLOW_{R'G'B'}$=0, the mapping results (e.g. "W Gain" and "W Shift" of Table 4) are 0 and 0, and $YELLOW_W'$=0*$YELLOW_W$+0=0;
when $YELLOW_{R'G'B'}$=1, the mapping results are 0 and 0, and $YELLOW_W'$=0*$YELLOW_W$+0=0;
. . .
when $YELLOW_{R'G'B'}$=204, the mapping results are 0 and 0, and $YELLOW_W'$=0*$YELLOW_W$+0=0;
when $YELLOW_{R'G'B'}$=205, the mapping results are 0.1 and 1, and $YELLOW_W'$=0.1*$YELLOW_W$+1, for example, suppose that $YELLOW_W$=10, so $YELLOW_W'$=2;
. . .
when $YELLOW_{R'G'B'}$=254, the mapping results are 0.492 and 50, and $YELLOW_W'$=0.492*$YELLOW_W$+50, for example, suppose that $YELLOW_W$=10, so $YELLOW_W'$≅55; and
when $YELLOW_{R'G'B'}$=255, the mapping results are 0.5 and 51, and $YELLOW_W'$=0.5*$YELLOW_W$+51, for example, suppose that $YELLOW_W$=10, so $YELLOW_W'$=56;
but the present invention is not limited thereto. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing display control of a display panel, the display panel comprising a plurality of pixels, the plurality of pixels comprising red, green, blue, and white sub-pixels, the method comprising:
    performing hue calculations on pixel data of an image frame to detect a yellow partial image of the image frame comprising a video object of the image frame having a yellow colour, and detect a white partial image of the image frame comprising a nearby white object of the image frame;
    determining a distance between the yellow partial image and the white partial image comprising a difference in brightness of the yellow partial image and brightness of the white partial image according to the hue calculations, and comparing the distance with a predetermined distance threshold to determine whether the yellow partial image and the white partial image are sufficiently close to each other; and when the yellow partial image and the white partial image are sufficiently close to each other, changing at least one of brightness of the yellow partial image and brightness of the white partial image by performing gain adjustment of at least one of the yellow partial image and the white partial image to reduce a brightness difference between the yellow partial image and the white partial image, for controlling the display panel to display the yellow partial image and the white partial image with the brightness difference being reduced, to prevent generating an incorrect color related to inherent deficiency of display capability of the red, the green, the blue, and the white sub-pixels.

2. The method of claim 1, wherein calculation results of the hue calculations indicate that contents of the yellow partial image comprise a predetermined range of hue, wherein the predetermined range of hue comprises hue corresponding to yellow color.

3. The method of claim 1, wherein calculation results of the hue calculations indicate that contents of the white partial image comprise at least one of a set of natural colors, wherein the set of natural colors comprises white and gray.

4. The method of claim 1, wherein the distance represents a size of a gap between the yellow partial image and the white partial image, and the predetermined distance threshold represents a predetermined gap-size threshold.

5. The method of claim 1, wherein the step of changing the at least one of the brightness of the yellow partial image and the brightness of the white partial image to reduce the brightness difference between the yellow partial image and the white partial image further comprises:

when the yellow partial image and the white partial image are sufficiently close to each other, changing the at least one of the brightness of the yellow partial image and the brightness of the white partial image to reduce the brightness difference between the yellow partial image and the white partial image, in order to eliminate a greenish effect of the display panel regarding the yellow partial image.

6. The method of claim 1, wherein the pixel data is carried by a set of one or more video signals; a set of display channels for sub-pixel rendering of the display panel comprises red, green, blue, and white display channels; and the method further comprises:

receiving the set of one or more video signals to obtain the pixel data, and performing at least one data conversion on the pixel data to generate red, green, blue, and white display data on the red, the green, the blue, and the white display channels, respectively, wherein an operation of changing the at least one of the brightness of the yellow partial image and the brightness of the white partial image is applied to at least one portion of the red, the green, the blue, and the white display data, for generating an updated version of the red, the green, the blue, and the white display data; and performing sub-pixel rendering to output the updated version of the red, the green, the blue, and the white display data to the display panel.

7. The method of claim 1, wherein changing the at least one of the brightness of the yellow partial image and the brightness of the white partial image comprises at least one of:

increasing the brightness of the yellow partial image; and
decreasing the brightness of the white partial image.

8. The method of claim 7, wherein a set of display channels for sub-pixel rendering of the display panel comprises red, green, blue, and white display channels; and increasing the brightness of the yellow partial image further comprises:

when an original brightness value of the yellow partial image on the red, the green, and the blue display channels is less than a predetermined brightness threshold, increasing the brightness of the yellow partial image on the red, the green, and the blue display channels.

9. The method of claim 7, wherein a set of display channels for sub-pixel rendering of the display panel comprises red, green, blue, and white display channels; and increasing the brightness of the yellow partial image further comprises:

when an original brightness value of the yellow partial image on the red, the green, and the blue display channels is greater than a predetermined brightness threshold, performing white display channel adjustment on the yellow partial image.

10. The method of claim 7, wherein a set of display channels for sub-pixel rendering of the display panel comprises red, green, blue, and white display channels; and decreasing the brightness of the white partial image further comprises:

when an original brightness value of the yellow partial image on the red, the green, and the blue display channels is less than a product of a predetermined ratio and an original brightness value of the white partial image on the white display channel, decreasing the brightness of the white partial image on the white display channel.

11. The method of claim 1, wherein any of the plurality of pixels comprises at least three of a red sub-pixel, a green sub-pixel, a blue sub-pixel, and a white sub-pixel.

12. An apparatus for performing display control of a display panel, the display panel comprising a plurality of pixels, the plurality of pixels comprising red, green, blue, and white sub-pixels, the apparatus comprising:

a color detection circuit, arranged to perform hue calculations on pixel data of an image frame to detect a yellow partial image of the image frame comprising a video object of the image frame having a yellow colour, and detect a white partial image of the image frame comprising a nearby white object of the image frame, wherein the color detection circuit determines a distance between the yellow partial image and the white partial image comprising a difference in brightness of the yellow partial image and brightness of the white partial image according to the hue calculations, and compares the distance with a predetermined distance threshold to determine whether the yellow partial image and the white partial image are sufficiently close to each other; and at least one adjustment circuit, coupled to the color detection circuit, arranged to selectively adjust brightness of the yellow partial image and selectively adjust brightness of the white partial image by performing gain adjustment of at least one of the yellow partial image and the white partial image;

wherein when the yellow partial image and the white partial image are sufficiently close to each other, the color detection circuit triggers the at least one adjustment circuit to change at least one of the brightness of the yellow partial image and the brightness of the white partial image to reduce a brightness difference between the yellow partial image and the white partial image, for controlling the display panel to display the yellow partial image and the white partial image with the brightness difference being reduced, to prevent generating an incorrect color related to inherent deficiency of display capability of the red, the green, the blue, and the white sub-pixels.

13. The apparatus of claim 12, wherein calculation results of the hue calculations indicate that contents of the yellow partial image comprise a predetermined range of hue, wherein the predetermined range of hue comprises hue corresponding to yellow color.

14. The apparatus of claim 12, wherein the calculation results of the hue calculations indicate that contents of the white partial image comprise at least one of a set of natural colors, wherein the set of natural colors comprises white and gray.

15. The apparatus of claim 12, wherein the distance represents a size of a gap between the yellow partial image and the white partial image, and the predetermined distance threshold represents a predetermined gap-size threshold.

16. The apparatus of claim 12, wherein when the yellow partial image and the white partial image are sufficiently close to each other, the color detection circuit triggers the at least one adjustment circuit to change the at least one of the brightness of the yellow partial image and the brightness of the white partial image to reduce the brightness difference between the yellow partial image and the white partial image, in order to eliminate a greenish effect of the display panel regarding the yellow partial image.

17. The apparatus of claim 12, wherein the pixel data is carried by a set of one or more video signals; a set of display channels for sub-pixel rendering of the display panel comprises red, green, blue, and white display channels; and the apparatus further comprises:
  a data conversion circuit, arranged to receive the set of one or more video signals to obtain the pixel data, and perform at least one data conversion on the pixel data to generate red, green, blue, and white display data on the red, the green, the blue, and the white display channels, respectively, wherein the at least one adjustment circuit applies an operation of changing the at least one of the brightness of the yellow partial image and the brightness of the white partial image to at least one portion of the red, the green, the blue, and the white display data, for generating an updated version of the red, the green, the blue, and the white display data; and
  a sub-pixel rendering circuit, coupled to the at least one adjustment circuit, arranged to perform sub-pixel rendering to output the updated version of the red, the green, the blue, and the white display data to the display panel.

18. The apparatus of claim 12, wherein changing the at least one of the brightness of the yellow partial image and the brightness of the white partial image comprises at least one of:
  increasing the brightness of the yellow partial image; and
  decreasing the brightness of the white partial image.

19. The apparatus of claim 12, wherein the apparatus comprises the display panel.

* * * * *